United States Patent [19]
Watanabe

[11] Patent Number: 5,418,389
[45] Date of Patent: May 23, 1995

[54] FIELD-EFFECT TRANSISTOR WITH PEROVSKITE OXIDE CHANNEL

[75] Inventor: Yukio Watanabe, Machida, Japan

[73] Assignee: Mitsubishi Chemical Corporation, Tokyo, Japan

[21] Appl. No.: 149,554

[22] Filed: Nov. 9, 1993

[30] Foreign Application Priority Data

Nov. 9, 1992 [JP] Japan .................. 4-298965

[51] Int. Cl.⁶ .............. H01L 29/78; H01L 39/22; G11C 11/22; C04B 35/46
[52] U.S. Cl. .................. 257/295; 257/39; 257/410; 365/117; 365/145; 501/134
[58] Field of Search .................. 257/36–39, 257/295, 410; 365/117, 145

[56] References Cited

U.S. PATENT DOCUMENTS

| | | | |
|---|---|---|---|
| 5,037,784 | 6/1991 | Raveau et al. | 501/134 |
| 5,218,512 | 6/1993 | Nakamura | 365/145 |
| 5,306,411 | 4/1994 | Mazanec et al. | 204/265 |

FOREIGN PATENT DOCUMENTS

| | | | |
|---|---|---|---|
| 64779 | 1/1989 | Japan | 257/39 |
| 4203396 | 7/1992 | Japan . | |

OTHER PUBLICATIONS

Science, vol. 246, Dec. 15, 1989, James F. Scott, et al., "Ferroelectric Memories", pp. 1400–1405.

1989 Ultrasonics Symposium, J. F. Scott, et al., "Ferroelectric Memory Applications", pp. 299–308.

Appl. Phys. Lett. 59 (27), Dec. 30, 1991, Timothy A. Rose, et al., "Ferroelectric Switching Of A Field-Effect Transistor With A Lithium Niobate Gate Insulator", pp. 3654–3656.

Ferroelectrics, 1976, vol. 11, pp. 379–383, S. Y. Wu, "Memory Retention And Switching Behavior Of Metal-Ferroelectric-Semiconductor Transistorsk".

J. Vac. Sci. Technol. A 10(4), Jul./Aug. 1992, S. Sinharoy, et al., "Integration Of Ferroelectric Thin Films Into Nonvolatile Memories", pp. 1554–1561.

IEEE Transactions on Electron Devices, vol. ED-21, No. 8, Aug. 1974, Shu-Yau Wu, "A New Ferroelectric Memory Device, Metal-Ferroelectric-Semiconductor Transistor", pp. 499–504.

Science, May 17, 1991, vol. 252, pp. 944–946, R. Ramesh, et al., "Epitaxial Cuprate Superconductor/Ferroelectric Heterostructures".

IEEE Transactions on Electron Devices, vol. 36, No. 3, Mar. 1989, Surya Veeraraghavan, et al., "Short-Channel Effects In SOI MOSFET's", pp. 522–528.

Jpn. J. Appl. Phys. vol. 31 (1992), pp. L1411–L1414, Ken Sakuta, et al., "Electric Field Effect In Al/SrTiO3-/YBa2Cu3Oy Structure In The Normal State".

(List continued on next page.)

Primary Examiner—Mahshid D. Saadat
Attorney, Agent, or Firm—Oblon, Spivak, McClelland, Maier & Neustadt

[57] ABSTRACT

A field-effect transistor (FET) is described having a source; a drain; a channel formed between the source and the drain; and a gate electrode. The channel is composed of a film layer of oxide having the perovskite structure comprised of: (1) at least one metal selected from the group consisting of the metal elements in Group IV through Group XI of the Periodic Table of Elements and Bi; and (2) at least one metal selected from the group consisting of alkali metals, alkaline earth metals and rare earth metals. The layer has a film thickness of not larger than 1000 Å and the electrical resistivity not less than 2 million centimeters. The channel of the oxide film layer is provided with a metal oxide insulator layer formed directly or through another metal oxide insulator layer and a gate electrode in electrical contact therewith. It is possible to make memories using this FET. In addition, it also becomes possible to reduce the size of devices using the FET of the invention.

17 Claims, 11 Drawing Sheets

OTHER PUBLICATIONS

Physical Review Letters, vol. 67, No. 15, Oct. 7, 1991, J. Mannhart, et al., "Influence Of Electric Fields On Pinning In YBa2Cu3O7-δ Films", pp. 2099–2101.

Solid-State Electronics, 1977, vol. 20, pp. 529–537, Kentaro Ito, et al., "Memory Modes Of Ferroelectric Field Effect Transistors".

Integrated Ferroelectrics, 1992, vol. 1, pp. 1–15, R. Ramesh, et al., "Fatigue And Aging In Ferroelectric PbZrO.2TiO.8O3/YBa2Cu3O7 Heterostructures".

Physical Review Letters, vol. 65, No. 27, Dec. 31, 1990, A. T. Fiory, et al., "Metallic And Superconducting Surfaces Of YBa2Cu3O7 Probed By Electrostatic Charge Modulation Of Epitaxial Films", pp. 3441–3444.

J. Appl. Phys. 69 (8), Apr. 15, 1991, A. Levy, et al., "Field-Effect Conductance of YBa2Cu3O6" pp. 4439–4440.

Appl. Phys. Lett. 59 (26), Dec. 23, 1991, X.X.Xi, et al., "Electric Field Effect In High Tc Superconducting Ultrathin YBa2Cu3O7-x Films", pp. 3470–3472.

⊗
CHANNEL DIRECTION

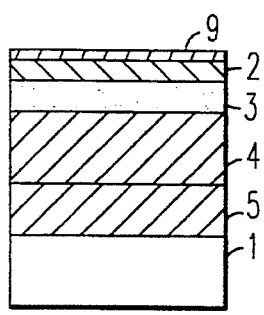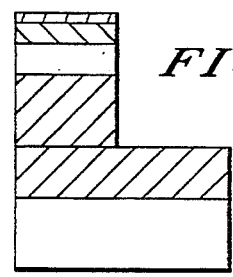
FIG. 5A-1   FIG. 5A-2
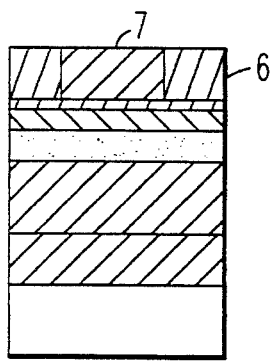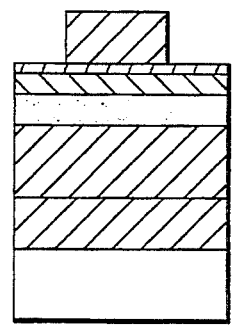
FIG. 5B   FIG. 5C
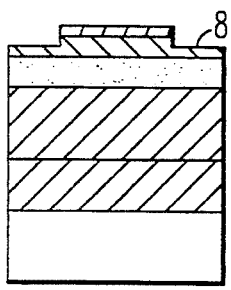
FIG. 5D

FIELD-EFFECT TRANSISTOR WITH PEROVSKITE OXIDE CHANNEL

BACKGROUND OF THE INVENTION

This application is related to Japanese Patent application no. 298965/1992 filed Nov. 9, 1992, incorporated herein by reference in its entirety.

1. Field of the Invention

This invention relates to a novel field-effect transistor (FET). More particularly, this invention relates to an FET composed of oxide layers and, in particular, to an FET that is useful as a non-volatile memory of an integrated circuit.

2. Discussion of the Background

Memories represent a substantial part of the semiconductor market. Besides RAMS, an ever-increasing share is taken by non-volatile memories. In recent years, some elements for non-volatile memories have been manufactured with a capacitor on a gate electrode of a silicon metal-oxide-semiconductor (Si-MOS). The elements utilize metal-nitride-oxide-silicon transistors in which the charges are trapped at the nitride oxide interface. The memory principle is based on Fowler-Nordheim tunneling to move charges from the substrate in the oxide or vice versa. Such memories are called electrically erasable programmable read-only memories (EEPROMS) where the charges trapped in the gate electrode can be removed electrically. EEPROMs are, however, disadvantageous in that they permit relatively slow erase and rewrite operations. Additionally, the number of rewrite cycles is extremely restricted because the rewrite operation requires relatively high voltage and the memories may thus be damaged after a large number of cycles. On the contrary, dynamic random-access memories (DRAMs) have fast access times but conventional Si oxide film systems are unable to provide sufficient level of modulation when DRAMs are integrated to have memory capacities of 256 Mb or more. In this respect, one object of this invention is to provide memory structures using perovskite oxide dielectrics such as $SrTiO_3$ having a large dielectric constant.

While the condition of charge storage of typical EEPROMs should be controlled externally, application of a unique EEPROM as a memory cell implementing ferroelectrics has also been developed. Ferroelectrics are crystalline substances having a permanent spontaneous electric polarization that can be reversed by an electric field. Thus, ferroelectrics are expected to be used for keeping desired conditions of charge storage without external control. A memory of the type described has long been studied and, in more recent years, active studies and considerations have been undertaken, stimulated and spurred by applications of the above mentioned perovskite dielectric to DRAMs. These memories are called ferroelectric random-access memories (FE-RAMs or FRAM), in which an electric field is applied in a predetermined direction between the gate and the substrate of the transistor. The electric field polarizes the gate insulation film of the transistor, thereby writing data into the memory cell. The data stored in the memory cell can be discriminated and readout by detecting the pulse current generated on reversing the polarization through application of the electric field. This readout process typically destroys the data stored in the memory cell (destructive readout), thus requiring circuits to restore it. In addition, the electric field applied to the ferroelectric in the readout process is as strong as that applied thereto in the writing process. Frequent application of such strong electric field adversely affects the lifetime of the ferroelectrics. Further, the signal current detected on readout is proportional to the area of the ferroelectric. This means that only a restricted degree of reduction can be made in the area of the cell and FE-RAM is thus unsuitable for large-scale integration.

The problems of such ferroelectric memories have long been considered with various studies as disclosed in, for example, M. L. Jeremy and M. J. Howes, A New Ferroelectric Memory Device, Metal-Ferroelectric-Semiconductor Transistor, IEEE Transactions on Electron Devices, vol. ED21, No. 8, page 499 (1974). Many other studies have been made in which ferroelectrics were used as a gate insulator of an FET and electrical resistivity of each channel of the FET is altered with electric charges induced on polarization. To read data, the electric current flowing between channels is detected. On the other hand, the remnant polarization is modified by applying an electric field to the ferroelectric to write data. $BaMgF_4$ and $Bi_3Ti_4O_{12}$ have been studied as ferroelectrics for that purpose since the ferroelectrics are restricted to those capable of being formed on a silicon or a gallium arsenide substrate. However, both ferroelectrics $BaMgF_4$ and $Bi_3Ti_4O_{12}$ have disadvantages of extremely high coercive force and low remanence. In addition, an interface layer is formed as a result of the reaction between the semiconductor and the ferroelectric, which causes degradation of characteristics and properties of the resultant memory. Further, the configuration of the thin films obtained is not matched well with the substrate, so that the end products are far from a satisfactory level of quality.

The above mentioned problem of fatigue has been recently improved. Fatigue is responsible for the relatively short lifetime of ferroelectric memories. For example, copper oxide superconductors are used as the top and bottom electrodes of the ferroelectric and these three layers are grown epitaxially into a multilayer to avoid repeated deterioration of the ferroelectric (R. Ramesh et al., "Fatigue and aging in ferroelectric $PbZr_{0.2}Ti_{0.8}O_3$ $YBa_2Cu_3O_7$ heterostructures," Integrated Ferroelectrics, vol. 1, No. 1, pages 1-15 (1992). This method, however, does not lead to a solution for the problem of the destructive readout. It would consequently be desirable to provide FETs that are applicable to non-volatile memories.

On the other hand, superconductive devices using oxide superconductors have been studied widely in recent years, in which the superconductive state is modulated by an electric field to provide a three terminal metal oxide-semiconductor field-effect transistor (MOSFET). Initially, Fiory et al. revealed that the carrier density of a thin $YBa_2Cu_3O_7$ film can be modulated by an electric field ("Metallic and superconducting surfaces of $YBa_2Cu_3O_7$ probed by electrostatic change modulation of epitaxial films", Physical Review Letters, vol. 65, No. 27 page 3441, 1990). Later, Levy et al. modulated the electric conductivity (electrical resistivity) of a $YBa_2Cu_3O_6$ film by depositing on one surface of a $SrTiO_3$ substrate a semiconductor-like thin $YBa_2Cu_3O_6$ film having low carrier density and forming an Ag electrode on the other surface of the substrate, which was used as a gate electrode to apply voltage to the gate (Journal of Applied Physics, vol. 69, page 4439, 1991). Stimulated by these studies, the field effect of copper oxide superconductors has been developed and expanded around $YBa_2Cu_3O_7$. Recently, a $YBa_2Cu_3O_7$ ultra-thin film (film thickness of equal to or less than 50 Å) has been deposited on a substrate, on which a dielectric such as $SrTiO_3$ is deposited. The gate electrode is formed thereon to modulate the superconductive transition temperature and the critical current density of the $YBa_2Cu_3O_7$ ultra-thin film (Applied Physics Letter, vol. 59, page 3470, 1991).

In the present invention, consideration has been given to the characteristics and properties of the copper oxides at ordinary temperatures. More particularly, this invention uses the specificity of copper oxides under the normal conductive state rather than the superconductive state when the copper oxides are applied as electronic devices. Studies have been made to modulate, by the field effect, semiconductive copper oxides having the same structure as the superconductive copper oxides, thereby providing novel FETs (Japanese Patent Application No. 203396/1992). Advanced studies have also been made with the aim of using this FET as a memory cell. In this way, the problem of the short channel effect encountered in conventional Si-MOSFETs is much improved with the thinner channel film thickness and the lower carrier concentrations suitable for the present FET. It has also been found that larger FETs of this invention can be integrated, exceeding the size limit of conventional Si-MOSFETs with less power consumption. More particularly, the limitations of Si-MOSFETs are overcome by using oxide semiconductors having a structure similar to that of the perovskite dielectrics having a large dielectric constant.

In addition, it is considered that the above mentioned ferroelectric memory is suitable for use as a nonvolatile memory in view of speed, lifetime and capability of storing information. In a preferred embodiment, the ferroelectric memory has a nondestructive readout of the FET type. However, conventional methods of modulating the electrical resistivity of the channel of Si or GaAs are disadvantageous in that it is difficult to lower the interface level due to the ferroelectric reaction and that excellent ferroelectrics can not be manufactured because of poor lattice-matching, which results in smaller degrees of electric modulations available for the electrical resistivity. The present inventor has found that the above mentioned problems can be overcome by using as the channel an oxide that has a similar lattice constant to the ferroelectric oxide and for which electrical resistivity can be varied through doping.

SUMMARY OF THE INVENTION

Accordingly, one object of the present invention, is to provide a field-effect transistor (FET) element having a source, a drain, a channel between the source and the drain, and a gate electrode, where the channel is composed of a thin-film layer of oxides having the perovskite structure comprised of (1) at least one metal selected from the group consisting of the metal elements in the group Ti, V, Cr, Mn, Fe, Co, Ni, Cu, Zr, Nb, Mo, Tc, Ru, Rh, Pd, Ag, Hf, Ta, W, Re, Os, Ir, Pt, Au, and Bi; and (2) at least one metal selected from the group consisting of alkali metals, alkaline earth metals and rare earth metals. The film thickness of the thin-film layer is not larger than 1000 Å while the electrical resistivity thereof is not less than 2 milli-ohm centimeters (mΩcm), The channel of the oxide layer is provided with a metal oxide insulator layer formed thereon directly or through other metal oxide insulator layer(s) and with the gate electrode contacting therewith.

These and other objects and features of the present invention will become more fully apparent from the following description and appended claims taken in conjunction with the accompanying drawings.

BRIEF DESCRIPTION OF THE DRAWINGS

FIGS. 3(a)–3(e) show processes for preparing the FET of the invention;

FIGS. 5(a)–(d) show other processes for preparing the FET of the invention;

DETAILED DESCRIPTION OF THE PREFERRED EMBODIMENTS

Figure 1A:
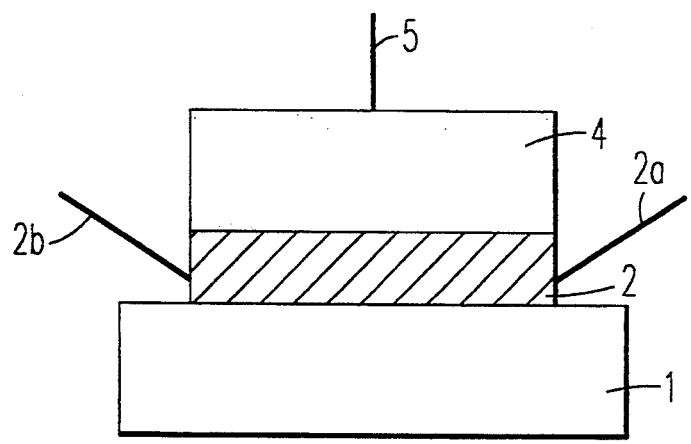
FIG. 1(a) is a view exemplifying the most fundamental structure of an FET according to the present invention.

Embodiments of the present invention are now described with reference to the drawings. Throughout the following detailed description, similar reference numerals refer to similar elements in all figures of the drawings.

FIG. 1(a) is a view exemplifying the most fundamental structure of an FET according to the present invention. This FET is similar in structure to Si-MOSFETs and comprises a substrate 1, a channel 2, a source 2a, a drain 2b and a metal oxide insulator 4 formed on the substrate 1, on which a gate is provided. At least the channel 2 is an oxide of the perovskite structure and the source 2a and the drain 2b are generally made of the same material as that of the channel 2.

In particular, an oxide ferroelectric is used as the metal oxide insulator when the FET according to the present invention is used as a non-volatile memory element. The memory element of this invention has the structure of an FET and stores as a memory the polarization conditions of the ferroelectric. The manner of readout and writing data in this element is similar to that in a conventional dielectric memory of the FET type. To erase the data, an electric field is applied between the channel 2 and the gate electrode 5 to polarize in a predetermined direction. In this event, the intensity of the electric field is higher than the resistance electric field of the ferroelectric and is preferably applied until the polarization is saturated. Data is read by applying an electrical current between the source $2a$ and the drain $2b$ of the FET to detect the generated voltage. Thus, the sign of the polarization generated in the channel of the FET depends on the direction of the polarization of the ferroelectric. Different voltage levels are generated when the sign of the polarization charge is identical to that of the carrier (either the p-type or the n-type) of the channel (condition where no electric field is applied) which results in a lower resistance than when the polarization charge and the channel have different signs which result in a higher resistance.

Material that has a varied electrical resistivity as a result of doping is used as the channel for the following reasons. Application of an electric field to the gate is responsible for polarization of the insulator layer, resulting in a change of the carrier density in the channel to alter the electrical resistivity. Therefore the carrier density dependence due to doping of the electrical resistivity can be considered as approximately the same phenomenon. Thus, an FET having a large modulation is produced with a composition (or made of materials) of which the electrical resistivity can be varied widely by doping. With such an FET, it is possible to improve signal to noise (S/N) ratio on readout.

Figure 2A:
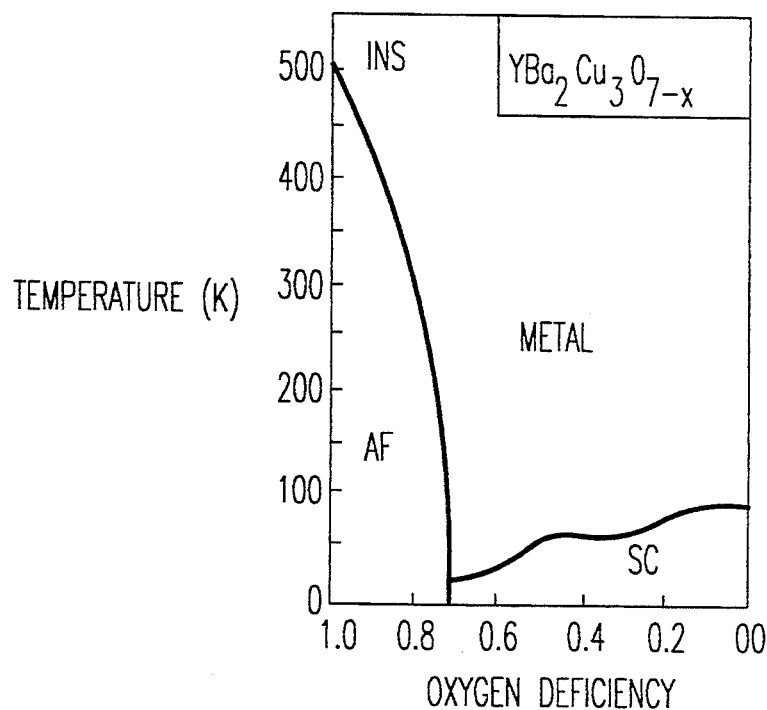
FIGS. 2(a) and 2(b) are graphs describing the relation between the electrical characteristics and the carrier density.
Figure 2B:
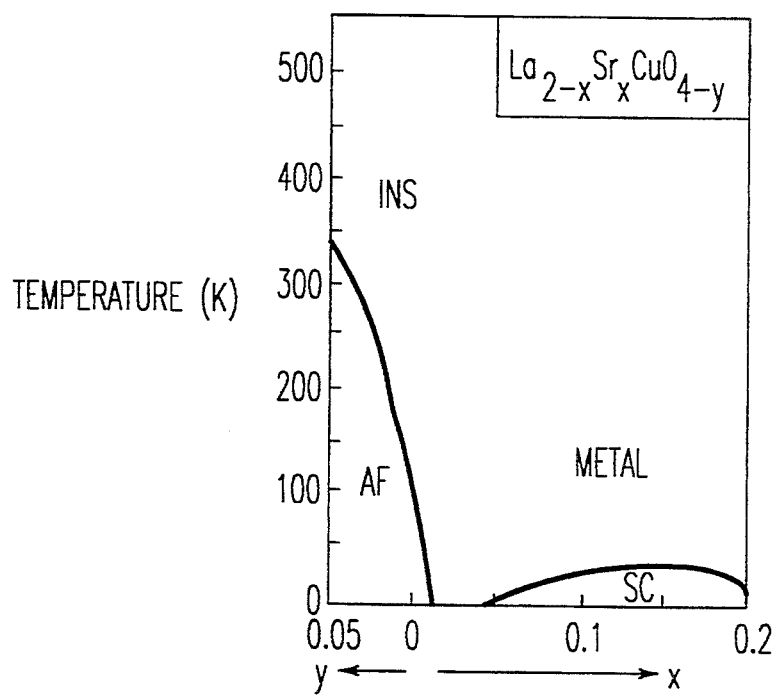
Figure 3E:
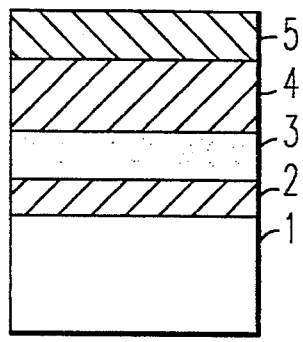
Figure 3E:
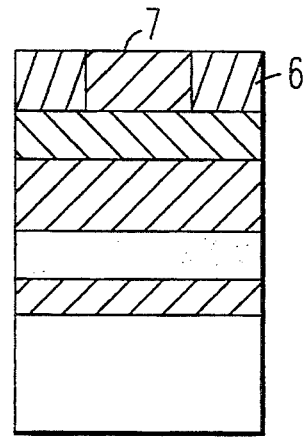
Figure 3E:
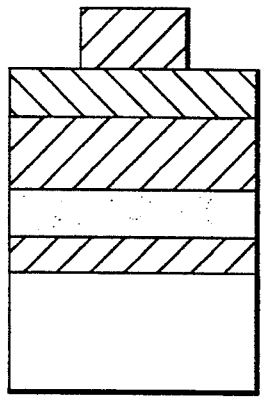
Figure 3E:
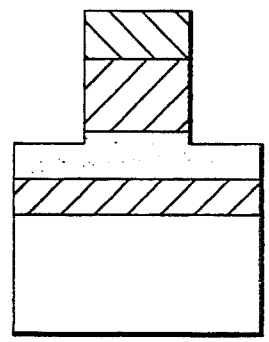
Figure 3E:
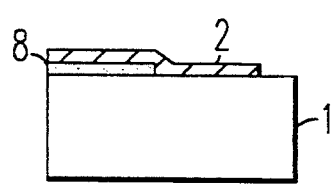
Figure 4A:
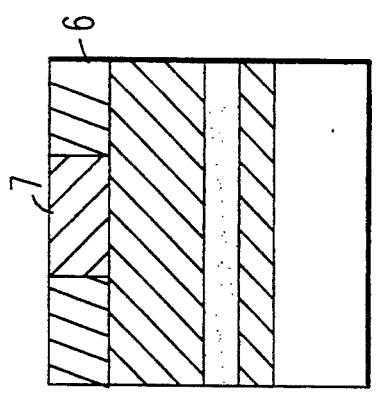
FIGS. 4(a)–4(d) show processes for preparing the FET of the invention.
Figure 4B:
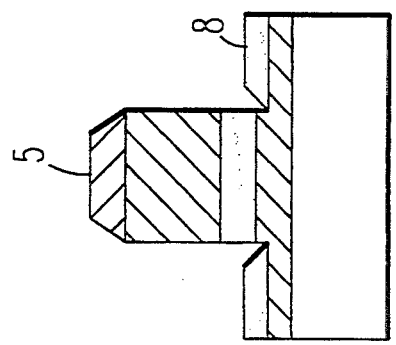
Figure 4C:
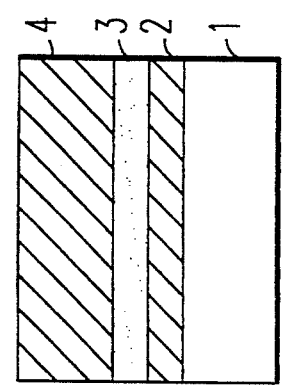
Figure 4D:
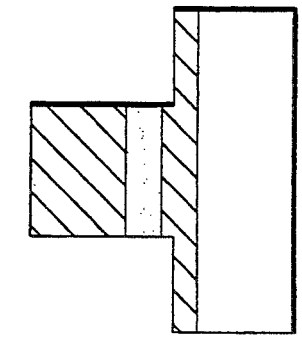

An adequate material for this purpose has the same crystal structure as copper oxide superconductors such as $YBa_2Cu_3O_7$ and $La_{2-x}M_xCuO_4$ ($x=0.05$ to $0.3$). This material has a carrier concentration significantly reduced as compared with the carrier concentration corresponding to the maximum superconductive transition temperature (Tc) of each material. Various materials for the copper oxide superconductors have been subjected to examination regarding the superconductive characteristics as a function of the carrier concentration. When the carrier concentration is reduced to a certain degree, no superconductive characteristics are exhibited. FIG. 2 shows the relationship between electrical properties of the copper oxide superconductor and the carrier density. In this figure, AF represents an antiferromagnetic phase (a semiconductor) and the curve thereof represents its Neel (Curie) temperature. SC represents a superconductive phase and the curve thereof represents its transition temperature. With this composition, the high-temperature side of the curve corresponds to metal-like conductivity. FIG. $2a$ is for $YBa_2Cu_3O_{7-x}$ while FIG. $2b$ is $La_{2-x}Sr_xCuO_{4-y}$. As apparent from FIG. 2, the abscissa axis (x, y) represents the amount of doping. In the AF (antiferromagnetic phase) domain the curve represents the Neel temperature. Likewise, the curve represents the superconductive transition temperature in the SC (superconductive phase) domain. Antiferromagnetic coupling between electrons is broken rapidly as a result of doping, resulting in rapid improvement of the electrical conductivity thereof.

Such a dramatic change of electronic state depending on the carrier concentration suggests that the characteristics of this oxide system are changed significantly by the electric field. In fact, as will be described in detail in conjunction with examples, it has been found that the doping dependency of the electrical resistivity is extremely large as compared with conventional semiconductors even in the high doping (low resistance) region where the oxide system does not become superconductive. The amount of change of the electrical resistivity by the electric field at room temperature is extremely small in conventional copper oxide superconductors. On the contrary, in the present invention, it is possible to cause a much larger amount of change of the electrical resistivity by the electric field even at room temperatures as compared with the field effect achieved by conventional copper oxide superconductors by means of (1) using a composition domain where the doping dependency of the electrical resistivity is large; and (2) using a composition domain where the surface density of the carrier is smaller than or equal to the polarization density caused by the dielectric.

In addition, a similar phenomenon can be found with $La_{1-x}M_xMnO_3$ (M=Ca, Sr or Ba; $x=0$ to $0.3$), $Nd_{1-x}Sr_xCoO_3$ ($x=0$ to $0.3$), and $La_{1-x}Sr_xCoO_3$ ($x=0$ to $0.3$). Such effects are obtained in insulating materials exhibiting an insulator metal transition as a result of doping, where the material has a strong electronic interaction such as a Mott-Hubbard insulator and charge transfer (CT) insulator (J. Zaanen et al., Physical Review Letters, vol. 55, page 418 (1985) and Watanabe et al., Physics, vol. C185-189, page 1011 (1991)). Equivalent superior doping effects are expected to be found when systems are doped that have no magnetic order but other electronic orders (for example, the charged density wave (CDW) and the spin density wave (SDW)).

The material to be used for the channel of the present FET is selected in consideration with the above mentioned conditions of the electrons. In particular, the material is selected from the oxides having the perovskite structure comprised of (1) at least one metal selected from the group consisting of the metal elements in the group Ti, V, Cr, Mn, Fe, Co, Ni, Cu, Zr, Nb, Mo, Tc, Ru, Rh, Pd, Ag, Hf, Ta, W, Re, Os, Ir, Pt, Au, and Bi and (2) at least one metal selected from the group consisting of alkali metals, alkaline earth metals and rare earth metals to improve the lattice matching to the perovskite ferroelectric and to eliminate the affect of interdiffusion when the ferroelectric is used as the insulator. This is because many oxide ferroelectrics have the perovskite structure. Particularly preferred are the oxides of the perovskite structure having a $ABO_2$ or $K_2NiF_4$ type crystal structure. Preferred examples are given below.

The semiconductive perovskite oxides having a low doping level in the crystal structures of copper oxide superconductors may be $LnBa_2Cu_3O_{5.5+x}$ ($0<x<1.5$ for Ln=Pr, or Ln is at least one element selected from the trivalent rare earth metals such as Y, Gd, Sm, Nd and Eu; $0<x<0.8$), $Bi_2Sr_2$ $(Ca_{1-y}Ln_y)_{n-1}Cu_nO_{4+2n+d}$ ($0<d<1$; $n=1$ to 3; Ln is a rare earth metal such as Y and Nd; $y=0.5$ to 1), $Ln_{2-z}M_zCuO_{4-d}$ ($0 \leq d \leq 0.2$; $z=0$ to $0.05$ and preferably 0 to 0.01; M is one of Sr, Ca, Ba, Ce and Lu; Ln is the rare earth metals such as La, Pr, Nd, Sm, Eu and Gd; as typical examples, $La_{2-z}Sr_zCuO_4$ and $Pr_{2-x}Ce_xCuO_4$) having the $K_2NiF_4$ crystal structure, and $(La_{1-x}Sr_x)$ $(Nd_{1-y}Ce_y)CuO_4$ ($x=0$ to $0.05$; $y=0$ to $0.05$; $x+y=0$ to $0.05$).

In addition, an alternative material is obtained by means of partially or entirely replacing Cu by other transition metals in Group VII through Group X such as Fe, Ni, Co and Mn and, as the case may be, Fe, Ni and Co. Practical examples thereof are $YBa_2Cu_2CoO_7$ (Co preferably replaces Cu in a one-dimensional chain), $Bi_2M_{n+1}Co_nO_{4+2n+d}$ ($0<d<1$; $n=1$ and 2; M is one of Ca, Sr and Ba; this chemical formula is obtained when Sr, Ca and Ln are replaced by M and Cu is replaced by Co in the formula $Bi_2Sr_2(Ca_{1-y}Ln_y)_{n-1}Cu_nO_{4+2n+d}$), $La_{2-z}Sr_zCoO_4$ ($z=0$ to 0.5), $La_{2-z}Sr_zNiO_4$ ($z=0$ to 0.5) and $Nd_{2-z}Sr_zNiO_4$ ($z=0$ to 0.5).

The semiconductive perovskite oxides other than those having a crystal structure similar to those of the copper oxide superconductors or the like include Sr(Ti, M)$O_3$ (M represents a transition metal such as Nb or Fe) having crystal structure $ABO_3$. In addition, also included are those represented by the general formula $Ln_{1-x}M_xTO_3$ (Ln is at least one rare metal selected from the group consisting of La, Ce, Pr, Nd, Sm, Eu, Gd, Tb, Dy, Ho, Er, Tm, Yb, Lu and Y); M is at least one element selected from the group consisting of Mg, Ca, Sr and Ba; T is a transition metal such as Ti, V, Cr, Mn, Fe, Co, Ni and Cu; $x=0$ to the solid soluble limit which is up to about 0.4 in general). Practical examples thereof are $La_{1-x}Sr_xTO_3$ ($x=0$ to 1), $La_{1-x}Sr_xVO_3$ ($x=0$ to 0.4), $La_{1-x}M_xCrO_3$ (M is one of Mg, Sr and Ba; $x=0$ to 0.2), $La_{1-x}M_xMnO_3$ (M is one of Ca, Sr and Ba; $x=0$ to 0.2), $La_{1-x}M_xFeO_3$ (M is one of Sr and Ba; $x=0$ to 0.4), $La_{1-x}M_xCoO_3$ (M is one of Sr and Ba; $x=0$ to 0.2), $La_{0.85}Ba_{0.15}Cr_{1-x}Fe_xO_3$ ($x=0$ to 1), $La_{0.85}Ba_{0.15}Mn_{1-x}Fe_xO_3$ ($x=0$ to 1), $La_{0.85}Y_{0.15}Mn_{1-x}Fe_xO_3$, $LaCo_{1-x}Mn_xO_3$ ($x=0$ to 0.1), those in which the transition metal T being further partially or entirely replaced with Nb, Ta, Mo or W such as $LnFe_{1-x}Mo_xO_3$ ($x=0$ to 0.25; Ln is one of La, Pr, Nd, Sm, Eu, Gd, Tb, Dy, Ho, Er, Tm, Yb, Lu and Y), $LaCo_{1-x}W_xO_3$, $LaCo_{1-x}Mo_xO_3$, $LaNi_{1-x}W_xO_3$ and $LaNi_{1-x}Mo_xO_3$ ($x=0$ to 0.25). If the oxide is represented by the general formula $Ln_{1-x}M_xTO_3$, then x is preferably not larger than 0.1.

Of the above mentioned $Ln_{1-x}M_xTO_3$ compounds, the ones for which conductivity can be readily controlled contain a transition metal (T is one of Ti, V, Cr, Mn, Fe, Co and Ni) and are obtained by means of partially replacing Ln by the alkaline earth metals. The conductivity of these oxides can be changed greatly as a result of doping (in general the resistance is reduced as a result of replacement). In particular, high conductivity is obtained more readily when the transition metal is either one of Ti, Mn, Fe, Co and Ni and the atomic number of the rare earth metal Ln (except for Y) is lower than that of Gd.

Similar results is expected when Bi(M, Ba)$O_3$ (M is an alkali metal or lead) or the like having lower carrier density is used for the channel layer. However, it is preferable to form the channel layer on the ferroelectric layer because this channel layer is manufactured at relatively low temperature.

To increase the amount of change of the electrical resistivity by the electric field, it is necessary to reduce the surface density of the carrier in the channel through optimization of the film thickness. The thickness of the present oxide thin-film layer is not larger than 1000 Å and preferably, ranges from 10 to 500 Å. As long as a good film is obtained, this thickness is preferably on the order of 100 Å. The effect of the surface level of the substrate becomes more serious with thinner films resulting in degradation of switching characteristics, so that it is necessary to improve the quality of the thin film as the film thickness thereof is reduced.

As mentioned above, it is possible to obtain a superior field effect by reducing the carrier density of the channel material and by forming the same into a thin film. In a common integrated circuit (IC), the current value typically ranges from 0.05 to 10 mA when the voltage applied to the channel ranges from 3 to 12 V, so that it is necessary to have the resistance value in the highly resistant condition of the channel correspond with this value. In addition, it is necessary to have the electrical resistivity at ordinary temperatures with no voltage applied be within the range between 100 $\Omega$cm to 5 m$\Omega$cm. To achieve the higher density, it is preferable to use smaller current with higher resistance because the lower carrier density results in a superior field effect as mentioned above. However, the current becomes too small and noise is increased when the resistance is extremely large. In addition, too high a resistance may result in an electrode inadequate for reversing polarization of the ferroelectrics. In this respect, the electrical resistivity of the channel layer at ordinary temperatures is not less than 2 m$\Omega$cm, and preferably ranges from 10 m$\Omega$cm to 10 m$\Omega$cm, and more preferably 10 m$\Omega$cm to 10 k$\Omega$cm. These values can be achieved in the low-doped material similar to the copper oxide superconductor.

Preferably used as the metal oxide insulator layer formed on the channel directly or through other metal oxide insulator layer(s) are dielectrics and ferroelectrics of the $ABO_3$ perovskite structure having a large dielectric constant such as $Ta_2O_5$ and $Sr_{1-x}Ba_xTiO_3$ ($x=0$ to 1).

A well-known PLZT, i.e., $(Pb_{1-x}La_x(Ti_{1-w}Zr_y)O_3$ ($x=0$ to 0.2; $y=0$ to 1; $s=0$ to 0.1, $s=0$ for $x=0$), and $Bi_3Ti_4O_{12}$ can be used as the ferroelectric layer. In this event, it is preferable that the ferroelectric properties are maintained after being formed into thin films and the remanent polarization is not lower than 1 microcoulomb/cm$^2$. It is also preferable that the coercive field value on being formed into the thin film is sufficiently smaller than the value 10 V divided by the film thickness (typically 100 kV/cm) and the coercive field value is sufficiently large compared with the level of minimum voltage on the gate and voltage fluctuations. In addition, it is necessary to have a sufficiently high electrical resistivity and have no pin-holes to ensure less leakage current from the gate to the channel (typically not larger than 1 uA/cm$^2$).

The crystallographic a- and b-axes of the ferroelectric PLT, the crystallographic a- and b-axes as well as 1/6 of the c-axis of $Bi_3Ti_4O_{12}$, $BaTiO_3$ and $YMnO_3$ have surfaces that will be lattice-matched quite well with the above perovskite oxides (except for heavy rare earth compounds exhibiting extreme lanthanoide contraction (Ho, Er, Tm, Yb and Lu) and some transition metals (e.g., Mn)). Accordingly, a less defective channel can be provided using these ferroelectrics to improve the switching characteristics. In addition, $Na_{1-x}K_xNbO_3$ ($x=0.01$ to 1, preferably $x=0.1$ to 0.8) is also applicable.

Since the polarization is preferably saturated at a low voltage and the gate switching voltage of 0.1 to 5 V, a ferroelectric layer having the smallest film thickness possible is preferable so long as satisfactory coercive fields can be obtained. In this event, extremely thin films may sometimes cause the leak current to be unnegligible or the ferroelectric properties to be lost. In this respect, the film thickness is typically within the range of 1000 to 5000 Å.

Such a thin ferroelectric film is preferably grown epitaxially on the channel layer. However, at least a portion thereof may be polycrystallized in the case where the leak current of the ferroelectric is reduced or the remanence is increased as a result of being polycrystallized. In addition, the ferroelectric film is preferably so oriented that the polarization, the electrical resistivity and the dielectric breakdown voltage in the direction of film thickness become maximum.

While the ferroelectric layer is generally a single layer of one kind of ferroelectric, properties such as the polarization, the electrical resistivity, the dielectric breakdown voltage and the coercive force can be improved by the following methods; (1) use of a multilayer structure composed of a ferroelectric and a dielectric, an antiferroelectric or another ferroelectric, (2) use of a super lattice of the same. In particular, it is preferable that the surface directly contacting the channel layer is highly insulated and has low defects. Further, the interface reaction with the channel layer should be controlled to a minimum, so that the ferroelectric is formed on an insulating material or a dielectric such as $Sr_{1-x}Ba_xTiO_3$ (x=0 to 0.6) that is capable of epitaxial growth on the channel layer and is well lattice-matched with the material of the channel layer. This intermediate layer may be made of the above mentioned material used for the channel that is not doped and has few carriers.

The gate electrode (the upper electrode) on the metal oxide insulator may be a metal having good conductivity such as conventionally used Pt, Au, Al and Cu or may be other conductive films and alloys. In addition, alternative materials are those described in conjunction with the channel material that are further doped to improve their conductivity as compared with the channel material.

The substrate may be made of materials that are lattice-matched well with the channel material. For example, materials where the minimum lattice surface of approximately 4 by 4 Å can be selected and little or no reaction is caused between the substrate and the channel layer on forming the latter. The substrate may be oxide single crystals of $MgO$, $SrTiO_3$, $LaAlO_3$, $NdGaO_3$, $PrGaO_3$, $LaSrGaO_4$, Nd-doped $YAlO_3$, YSZ (Y-doped $ZrO_2$) and oxides of the rare earth metals such as $Y_2O_3$, $Gd_2O_3$, $CeO_2$ and $Dy_2O_3$. Sapphire, Si and GaAs substrates having the above oxide films as a buffer layer may also be used as the substrate to inhibit the interface reaction. In addition, the substrate may be made of an amorphous material such as glass on which the buffer layer is formed.

Since the first suggestion of FETs dates back to the first half of this century, formation of a $SiO_2$ film of high quality and application of p-n junction essentially enables practical use of the Si-MOSFET. In the present invention, the FET is enabled to operate by means of epitaxially growing films that exhibit less interdiffusion and making the thickness of the conductive layer as thin as possible. In particular, the former issue becomes possible only with the materials according to the present invention. Thus, the improved characteristics can be obtained by selecting combinations of materials exhibiting less interdiffusion and selecting a preparation method for growing the films. To further improve the FET characteristics, it is possible to use the p-n junction at the channel as in the Si-MOSFET or to increase the conductivity of the semiconductive layers on, for example, the contacts as compared with the semiconductive layer just beneath the gate electrode. This also contributes to reduction of contact resistance.

Figure 1B:
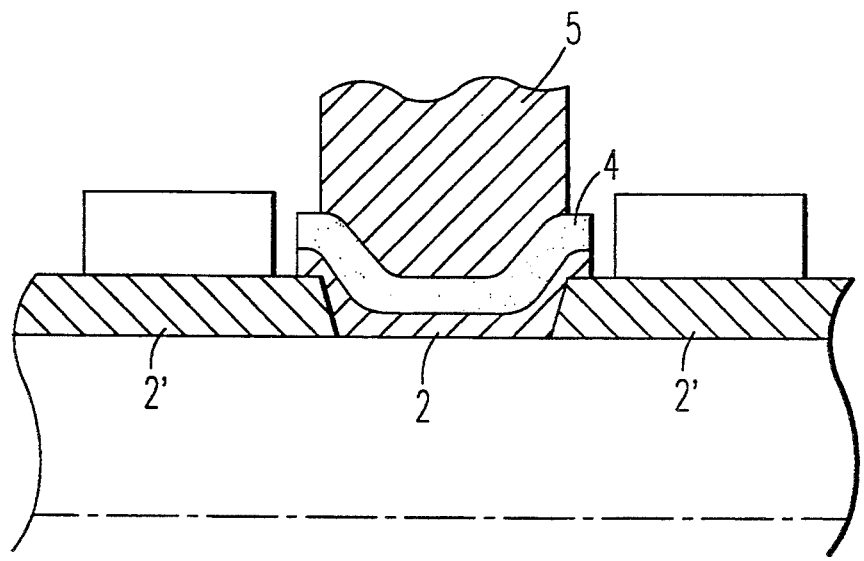
FIG. 1(b) is a view exemplifying a preferred structure of a FET according to the present invention.

To increase the conductivity as described in the latter case and as shown in FIG. 1(b), it is enough to set x on the other parts (2') to be larger than that just beneath the gate electrode (2) in, for example, $La_{2-x}Sr_xCu_4$, $Nd_{2-x}Ce_xCu_4$ and $La_{1-x}Sr_xTO_3$ (T represents one of Mn and Fe). Typically, x ranges from 0 to 0.01 in 2 and x ranges from 0.05 to 0.10 in 2'.

The p-n junction with these materials is usually difficult to form and it is necessary to use alternative materials. $Nd_{2-x}Ce_xCu_4$ and $Pr_{2-x}CeCu_xO_4$ are n-type but most of the above mentioned materials can be used only to provide p-type semiconductors. However, some kinds of $LnTO_3$ (Ln represents a rare earth metal or an alkaline earth metal and T represents a transition metal) are an exception to this and are applicable to prepare an n-type semiconductor by means of replacing Ln by Th where T=Co or to prepare the same by replacing Ti by Nb or deleting oxygen in $SrTiO_3$. In addition, it has been reported that the partially Mo-replaced T of $LnTO_3$ also results in an n-type conductor.

For manufacturing the FET comprising the p-n junction as shown in FIG. 1(b) with the above mentioned materials, it is necessary to reverse the conductive type of 2' and 2. In addition, it is preferable that the conductivity of 2' is high (the amount of aforementioned x is large) to reduce the contact resistance. For example, 2' may be defined as $La_{2-x}Sr_xCuO_4$ (x=0.05 to 0.10) and 2 may be defined as $Nd_{2-x}Ce_xCuO_4$ (X=0 to 0.01).

Further, it has been reported that both the p- and n-types are obtained with the specific materials such as $(La_{1-x}Sr_x)(Nd_{1-y}Ce_y)CuO_4$ and $(La_{1-x}M_x)CoO_3$ (M represents Sr or Th). This material may be used to manufacture the above mentioned p-n junction with the materials of the same type.

For the deposition of each layer, it is preferable to form the thin films with the temperature of the substrate reduced as the layer is laid down, thereby avoiding degradation of underlying layers for formation of multilayer structures. The resultant FET can be processed with a wet or dry etching system. The wet etching system is generally operated with acids (HF, HCl, $HNO_3$, $H_2SO_4$, $H_3PO_4$, Br ethanol, acetic acid and oxalic acid). On the contrary, a plasma etching system (with a mixed gas of, for example, Ar, $O_2$, $N_2$, $Br_2$, $CH_xCl_{4-x}$, $CH_xF_{4-x}$) and an ion (or atom) milling system (with Ar, $O_2$, $N_2$, $Br_2$, $Cl_2$) are commonly used for dry etching. The etching speed of the upper layer is preferable higher than that of the lower layer. This can be achieved by means of a selective etchant or selecting materials that are more likely to be etched for the upper layers. For example, the substrate temperature optimum for thin film formation becomes higher in the order of metal, PZT, $YBa_2Cu_3O_7$, $La_{2-x}Sr_xCuO_4$ and $Nd_{2-x}Ce_xCuO_4$, so that the deposition is preferably made in the order of the channel layer $La_{2-x}Sr_xCuO_4$ (or $Nd_{2-x}Ce_xCuO_4$), the insulator PZT, and the gate electrode metal (or $YBa_2Cu_3OT$).

Typically the channel, the ferroelectric layer and the (top) gate electrode are formed on the substrate in this order. However, they may be deposited on the substrate in the order of the gate electrode, the ferroelectric layer, the channel and a protective layer as the case may be when a conductive oxide is used as the gate electrode. The latter method is advantageous in that a wide area on the channel is affected by the ferroelectric, allowing a wide area of modulation and a simple and easy patterning.

A variety of deposition techniques are available for forming the thin film layers on the substance. For example, the processes include physical vapor deposition (PVD) and the chemical vapor deposition (CVD). PVD includes vacuum deposition, sputtering and laser deposition. Likewise, CVD includes metalorganic CVD (MO-CVD) and plasma enhanced CVD.

The FET can be processed through various known methods. An example of these methods is the lithography technique. The typical lithography process is carried out using photoresists or an electron beam resist. Other known techniques such as focused ion beam exposure and X-ray exposure are also available to process the FET according to the present invention. If it is required to arrange a transistor on the present memory element by using a silicon substrate or the like, the transistor is previously formed on the silicon substrate before forming the thin film. While the FET is formed with two kinds of metal masks (or silicon masks) in the following Example described below, some of the industrial processes on elements are briefly outlined now.

FIGS. 3 through 5 describe methods of manufacturing the FET according to the present invention. Reference numerals 1 and 2 represent the substrate and the channel layer, respectively, while reference numerals 4 and 5 represent the ferroelectric layer and the gate electrode, respectively, as described in conjunction with FIG. 1. Reference numeral 3 represents a dielectric layer while reference numeral 6 represents a solvent-soluble resist coating. Reference numeral 7 represents a resist mask. Reference numerals 8 and 9 represent a channel electrode that is source or drain and an insulating protective film, respectively. Each of FIGS. 3 and 4 corresponds to a method of forming the thin films on the substrate in the order from the channel while FIG. 5 corresponds to a method of forming the same in the order from the gate. In the former method, a contact to the channel may be formed by means of, as shown in FIG. 3, etching to the upper surface of the channel layer 2 after the gate electrode 5 is formed. Alternatively, the contact to the channel 2 and the gate electrode 5 are formed by means of, as shown in FIG. 4, etching to the upper surface of the channel layer 2 after the dielectric layer 3 is formed.

For the cases shown in FIGS. 3 and 4, the structure may be patterned after forming the channel layer 2 and before forming the gate electrode 5. The channel layer 2 may be previously formed by means of forming, before depositing of the channel layer 2, a thin film layer 8 (e.g., Si, Zn, Cr and compounds thereof) at a position not corresponding to the channel layer 2 to markedly reduce the electrical conductivity as a result of reaction with the channel layer 2 (see, FIG. 3e).

The aforementioned processes are now described with reference to the drawing. In FIG. 3, an FET is illustrated with dielectric and ferroelectric layers for the purpose of generalization. First, the multilayer is formed up to the upmost layer of the gate electrode 5 (FIG. 3a), on which the resist coating 6 is applied. The portion of the resist coating 6 just above the gate electrode hardens after exposure (FIG. 3b). The unexposed parts of the resist 6 are then dissolved and washed away (FIG. 3c), leaving the resist mask 7. The multilayer is etched while retaining at least the channel layer 2 unetched (FIG. 3d). Both sides of the channel layer 2 serve as the source and the drain, respectively. The source and the drain may later be subjected to, for example, an ion implantation to improve the electric conductivity thereof and, in turn, the conductivity between these regions and wiring. Alternatively, a material having high conductivity may previously be deposited thereon before formation and patterning of the channel layer. In the method shown in FIG. 4, the layers are deposited to the ferroelectric layer 4 (FIG. 4a) and etched with the channel layer 2 being retained (FIGS. 4b and 4c) in the same manner as disclosed in conjunction with FIGS. 3b, 3c and 3d. The gate electrode 5, the channel electrode 8 are then deposited and the wiring are again patterned.

In the method shown in FIG. 5, the thin films are formed in the order from the gate electrode 5. Etching is made to the upper surface of the gate electrode after the channel layer 2 is formed. A contact is formed by means of etching a portion of the channel protective film. The insulating protective layer 9 is formed on the channel layer 2 (FIG. 5a), on which the resist coating 6 is applied. Only the resist mask 7 is left on the channel layer 2 (FIG. 5b) and the remaining part of the resist 6 is removed (FIG. 5c). The protective layer 9 is then etched to form the source drain electrode 8 on the channel layer 2.

When the FET according to the present invention is used as a non-volatile memory element with the ferroelectric for the metal oxide insulator layer, an exemplified circuit has the following structure. In such FET, an address buffer (address control) and word lines connected thereto, a switching element (FET) for a bit line and the memory element according to the present invention may be arranged to form a memory IC. In addition, it is known that the ferroelectric has poor threshold value properties and thus an error (referred to as Half Select Pulse Disturbance) due to interference between the FETs in the present invention is caused. In this respect, a common method of circuit design arranges one through three transistor(s) for every one ferroelectric memory element to apply voltage to the ferroelectric(s) of the desired ferroelectric memory element only when both of the word and bit lines are selected. This technique can equally be introduced into the memory IC using the FET according to the present invention. However, the memory IC implementing the present FET may be designed to update and rewrite data for every one block. The transistor is typically composed of Si elements, so that an Si substrate or a GaAs substrate in which these transistor circuits are implemented is used for the substrate of the present FET. These transistors may be formed with the FET of the present invention. A simple example of the FET used in this case is an FET having a dielectric oxide as a metal oxide insulator. In such a case, no Si or GaAs substrate is required.

Other applications of the present FET rely on various known techniques and methods where the ferroelectrics are formed on a conventional semiconductor FET.

For example, an application is found in Afanasjev et al., "The functional possibilities of ferroelectric-semiconductor structure", Ferroelectrics, vol 83, pages 197 to 204, 1988 This article shows that it is possible to use ferroelectric-semiconductor structures as controlled semiconductor resistors and photoresistors with memory.

Other features of the invention will become apparent in the course of the following descriptions of exemplary embodiments which are given for illustration of the invention and are not intended to be limiting thereof.

EXAMPLES

Example 1

PrBa$_2$Cu$_3$O$_7$ powders of 99.9% purity were sintered at 950° C. to prepare a target. This target, a sintered product of SrTiO$_3$ and a PbTi$_{0.8}$Zr$_{0.2}$O$_3$ target prepared by mix-sintered PbO, TiO$_2$ and ZrO$_2$ were disposed on a target holder in a vacuum device. The substrate used was a SrTiO$_3$ (100) substrate of high abrasibility (surface roughness of approximately 20 Å).

A semiconductive PrBa$_2$Cu$_3$O$_{6+d}$ thin film was deposited to approximately 200 Å in an oxygen pressure of 100 mtorr and at a substrate temperature of 720° C. using excimer laser deposition via a contact mask. An ArF laser was used for the layer deposition at a laser power density of approximately 1 J/cm$^2$ and an effective cycle frequency of 2 Hz. A uniform deposition speed was achieved by means of rotating the targets while scanning them with the laser. Subsequently, the targets were kept for about 2 hours in the same vacuum atmosphere at the reduced substrate temperature of 550° C. The contact mask was then replaced to deposit a SrTiO$_3$ film of 500 Å in thickness in an oxygen pressure of 100 mtorr. A PbTi$_{0.8}$Zr$_{0.2}$O$_3$ film 4000 Å thick was laminated under the same conditions except the substrate temperature was 550° C. to provide an FET element structure.

X-ray diffraction analysis indicated a result corresponding to the c-axis orientation of the above films.

Figure 6:
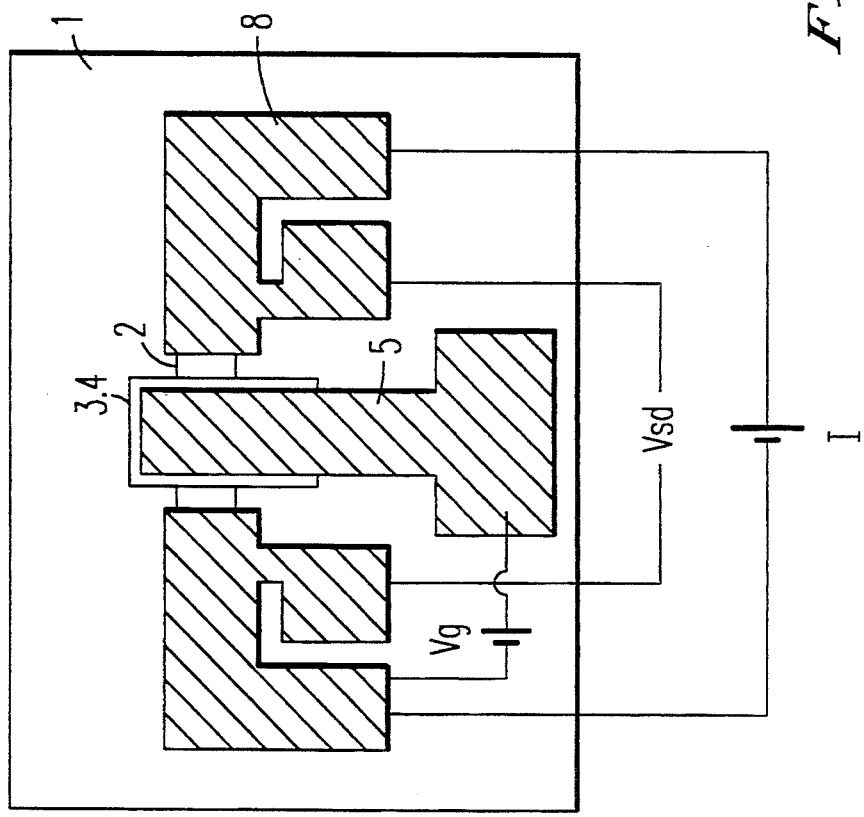
FIG. 6 shows an FET measurement arrangement applied to Example 1.
Figure 7:
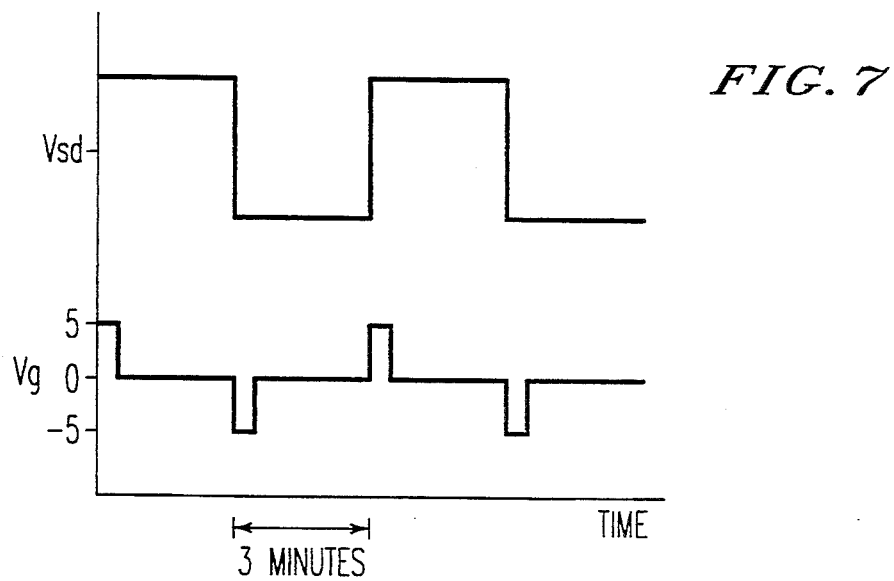
FIG. 7 shows characteristics of the FET obtained in Example 1.

The substrate temperature was reduced to around room temperature and the device was taken out of the vacuum chamber. Gold was then deposited on the device with a contact mask for electrode formation. The electrical resistivity of the channel layer film that is not affected by the ferroelectric was measured at a position other than the FET at room temperature. The electrical resistivity was about 0.1 Ωcm. This element was arranged into a circuit as shown in FIG. 6 and the PrBa$_2$Cu$_3$O$_{6+d}$ layer was provided with current flow with various gate voltages to read the voltages. A current I was used in the channel electrodes 8 corresponding to the source and the drain, respectively, and a voltage Vg was applied to the gate electrode 5 to change the polarization of the ferroelectric, thereby measuring a voltage Vsd generated between the channel electrodes 8. The voltage Vg was reversed for a predetermined time to turn the memory ON and OFF. The result was as shown in FIG. 7. The generated voltage Vsd was modulated by Vg and memory characteristics are exhibited after a significant time interval has passed.

Example 2

A La$_2$Cu target was prepared by means of arc-melting La and Cu as an alloy. This target and a sintered product of PbTi$_{0.8}$Zr$_{0.2}$O$_3$ were disposed on a target holder in a vacuum chamber. An FET was manufactured by means of successively depositing these films on a SrTiO$_3$ (100) substrate with good flatness using the excimer laser deposition as disclosed in Example 1.

A semiconductive La$_2$CuO$_4$ film was deposited to approximately 200 Å in an oxygen pressure of 100 mtorr and at a substrate temperature of 750° C. via a contact mask. Subsequently, the contact mask was replaced to deposit a PbTi$_{0.8}$Zr$_{0.2}$O$_3$ film 4000 Å thick under an oxygen pressure of 100 mtorr at a reduced substrate temperature of 550° C.

Figure 8:
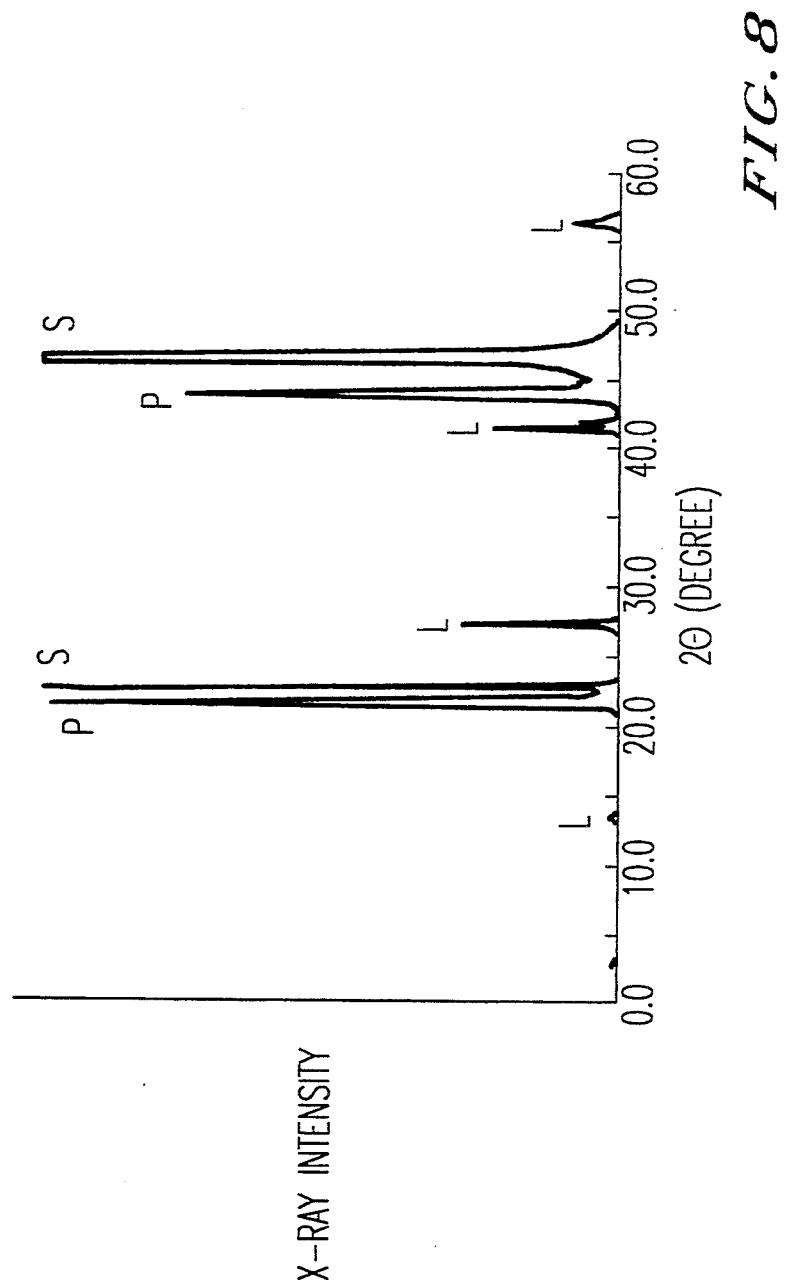
FIG. 8 is a X-ray diffractometry trace of a $PbTi_{0.8}Zr_{0.2}O_3/La_2CuO_4$ multilayer on a $SrTiO_3$ (100) substrate used for the FET in Example 2.

The substrate temperature was reduced to around room temperature and the element was taken out of the vacuum chamber. Gold was then deposited on the element with a contact mask for electrode formation. X-ray diffraction analysis indicated a result corresponding to the excellent c-axis orientation of the above films (FIG. 8). In FIG. 8, S, L and P represent (001) peaks of the SrTiO$_3$ substrate, La$_2$CuO$_4$ and PbTi$_{0.8}$Zr$_{0.2}$O$_3$, respectively. The electrical resistivity of the channel layer film that is not affected by the ferroelectric was measured at a position other than the FET at room temperature. The electrical resistivity was about 0.3 Ωcm. This FET was subjected to a measurement similar to that described in Example 1. A similar switching memory operation was performed in correspondence with the positive and negative voltage applied to the PbTi$_{0.8}$Zr$_{0.2}$O$_3$ film.

Example 3

Instead of PrBa$_2$Cu$_3$O$_{6+d}$ and PbTi$_{0.8}$Zr$_{0.2}$O$_3$ in example 1, an FET was made with La$_{2-x}$Sr$_x$CuO$_4$ and BaTiO$_3$ layers.

A La$_{2-x}$Sr$_x$CuO$_4$ (x=0.01) sintered target and a BaTiO$_3$ sintered target were mounted on a target holder in a vacuum chamber. A SrTiO$_3$ (100) single crystal substrate was glued with silver paste on a block heater in the vacuum chamber.

A 400 Å thick La$_{2-x}$Sr$_x$CuO$_4$ (x=0.01) film was laser deposited onto the substrate at an O$_2$ pressure of 0.5 mtorr and at 750° C., using an ArF laser. After the La$_{2-x}$Sr$_x$CuO$_4$ deposition, the substrate temperature was set at 630° C. A 3000 Å thick BaTiO$_3$ film was laser deposited on the La$_{2-x}$Sr$_x$CuO$_4$ layer under the same vacuum at an O$_2$ pressure of 5 mtorr. After the deposition, the vacuum chamber was filled with more than 100 torr of O$_2$ and the substrate was cooled down to room temperature.

Figure 9:
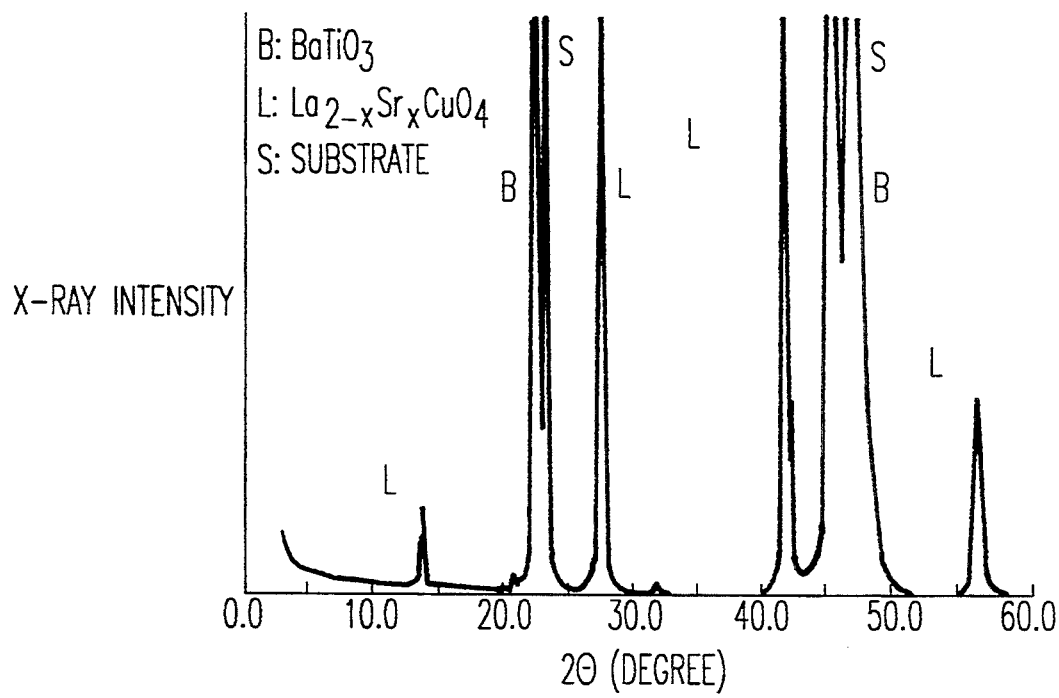
FIG. 9 is an X-ray diffractometry trace of a $BaTiO_3/La_{2-x}Sr_xCuO_4$ multilayer on a $SrTiO_3$ (100) substrate used for the FET in Example 3.

The film was examined by X-ray diffraction and by X-ray fluorescent analysis. FIG. 9 shows that c-axis oriented BaTiO$_3$/La$_{2-x}$Sr$_x$CuO$_4$ multilayer was epitaxially grown on the substrate. S, L and B indicate (001) peaks of the SrTiO$_3$ substrate, La$_{2-x}$Sr$_x$CuO$_4$ layer and BaTiO$_3$ layer, respectively.

The sample was transferred into another vacuum chamber and was Ar-ion-beam etched using a metal mask, leaving 1.2 mm by 1.2 mm square areas for gates. In another vacuum chamber, 1 mm$^2$ square areas on the gates and on a part of etched area were coated with gold as gate electrodes and as source and drain electrodes through metal mask.

High resolution SEM observation of the fractured cross section showed that a well defined interface between two layers was obtained and that the BaTiO$_3$ layer and a part of La$_{2-x}$Sr$_x$CuO$_4$ layer were etched. The final structure looked similar to FIG. 4(d) without a dielectric layer 3.

Contact resistance at the sources and the drains were reduced two orders by applying a voltage between them up to 10 V. Resistance between a source and a drain was typically a few 100 kΩ, which suggested that 90% of the resistance was due to the contact resistance. When the resistance was measured through scratched pinholes on the gates, the resistance for the same configuration was 10 kΩ, which is the same as those for single layered films. This suggested also a good interface between the semiconducting channel 2 layer and the ferroelectric gate 4 layer, and an absence of significant damage or interdiffusion at the interface.

Figure 10:
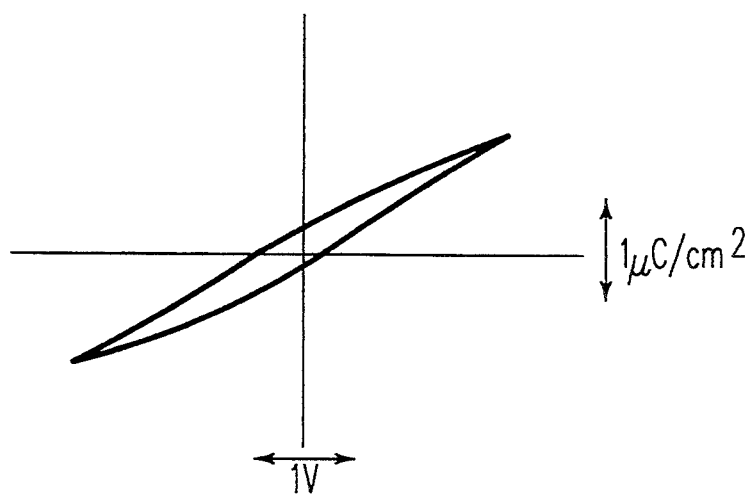
FIG. 10 is a D-E hysteresis graph of a gate ferroelectric on a FET measured by a Sawyer-Tower circuit as in Example 3.

D-E hysteresis was measured using a Sawyer-Tower circuit and applying voltage between the gate and the source. FIG. 10 shows an example of D-E hysteresis. Leakage current through the gate was less than 10 $nA/cm_2$ at 1 V. These results suggested ferroelectricity of the $BaTiO_3$ gate.

Figure 11:
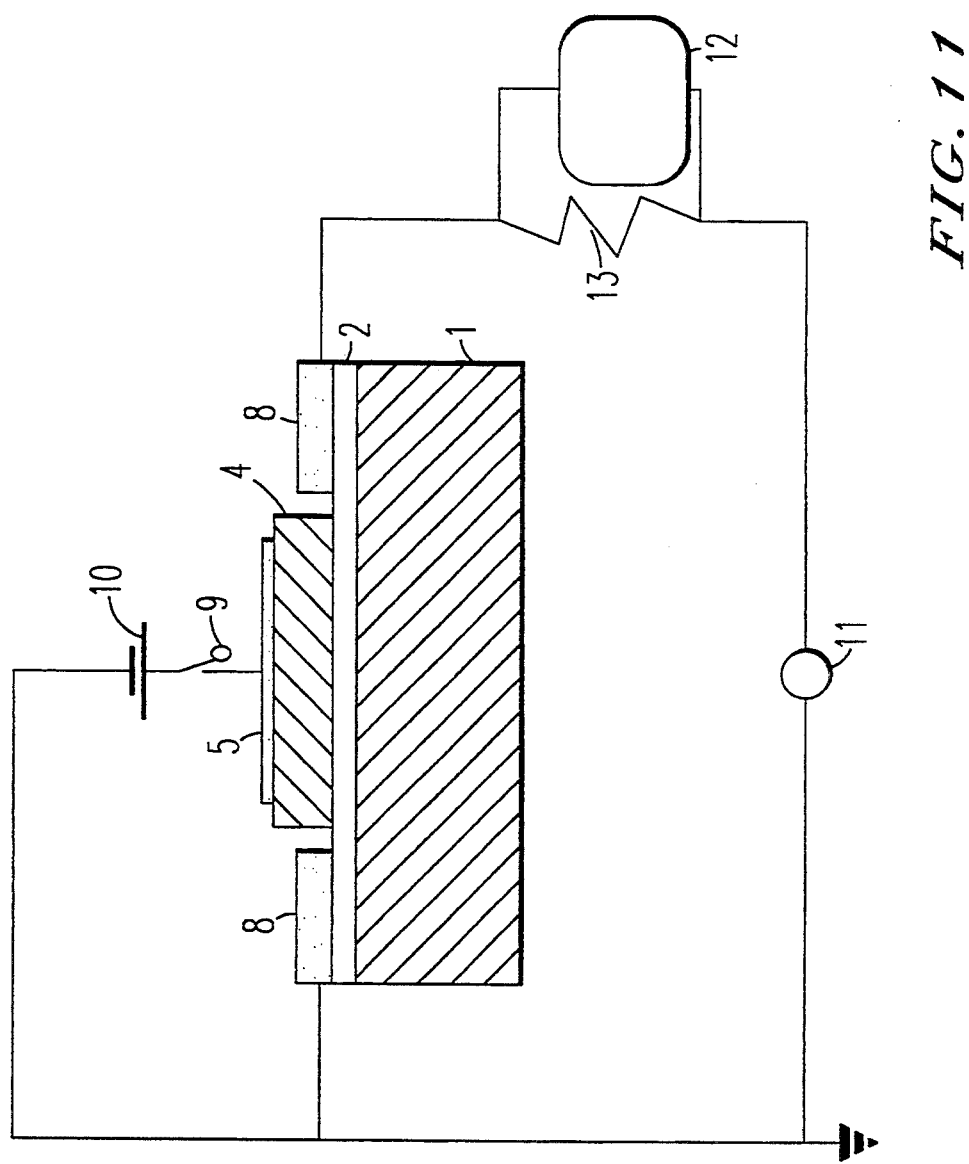
FIG. 11 shows circuit for measuring an FET memory operation in Example 3.

The FET memory effect was measured using a circuit shown in FIG. 11. AC voltage of 0.4 V and 100 Hz was applied between source 8 and drain 8. DC voltage of ±1 V was applied between gate electrode 5 and drain 8 for 30 sec. and switch 9 was off. Reference resistance 13 of 10 kΩ was used to measure the change in current in channel 2. 30 sec. after switch-off of the gate bias, voltage at the reference resistance was measured with an oscilloscope 12. These measurements were repeated. The voltage after +1 V bias was 1% higher than the voltage after −1 V bias. Considering the contact resistance mentioned above, channel 2 resistance changed about 10%.

Example 4

$Nd_2O_3$, $CoO$ and $SrCo_3$ powders of 99.9% purity were sintered at 950° C. to prepare an $Nd_{0.95}Sr_{0.05}CoO_3$ target. This target and a sintered product of $PbTi_{0.8}Zr_{0.2}O_3$ were disposed on a target holder in a vacuum chamber. An FET was manufactured by means of successively depositing these films on a $SrTiO_3$ (100) substrate of high abrasibility utilizing excimer laser deposition in the same manner as disclosed in Example 1.

A semiconductive $Nd_{0.95}Sr_{0.05}CoO_3$ film was deposited to approximately 200 Å at an oxygen pressure of 100 mtorr and at a substrate temperature of 720° C. via a contact mask. Subsequently, the contact mask was replaced and the substrate temperature was lowered to 550° C. to deposit a $PbTi_{0.8}Zr_{0.2}O_3$ film 4000 Å thick in an oxygen pressure of 100 mtorr. X-ray diffraction analysis indicated a result corresponding mainly to the c-axis orientation of the $PbTi_{0.8}Zr_{0.2}O_3$ film.

The substrate temperature was reduced to around room temperature and the element was taken out of the vacuum chamber. Gold was then deposited on the element with a contact mask for electrode formation. The electrical resistivity of the channel layer film that is not affected by the ferroelectric was measured at a position other than the FET at room temperature. The electrical resistivity was about 0.1 Ωcm. This element was subjected to a measurement similar to that described in Example 1. A similar switching memory operation was performed in correspondence with the voltage applied to the gate.

Example 5

Figure 12:
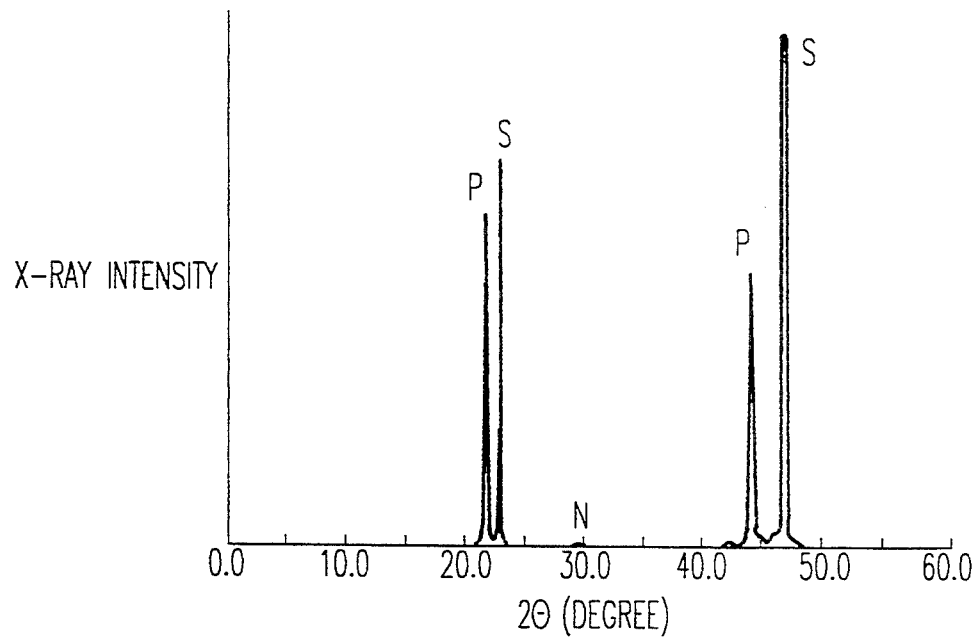
FIG. 12 is an X-ray diffractometry trace of a $PbTi_{0.8}Zr_{0.2}O_3/Nd_{2-x}Ce_xCuO_4$ multilayer on a $SrTiO_3$ (100) substrate used for the FET in Example 5.

An FET was made with $PbTi_{0.8}Zr_{0.2}O_3/Nd_{2-x}Ce_xCuO_4$ (x=0.01) in a similar manner to the example 3. A double layer was grown epitaxially on a $SrTiO_3$ substrate. The $Nd_{2-x}Ce_xCuO_4$ layer was c-axis oriented and the $PbTi_{0.8}Zr_{0.2}O_3$ layer was mostly c-axis oriented with a small mixture of a-axis orientation. Channel resistance modulation was also observed as in the example 3. FIG. 12 shows X-ray diffraction of the multilayer, which suggested a good interface without reaction of the two layers. S, N and P indicate (001) peaks of the $SrTiO_3$ substrate, $Nd_{2-x}Ce_xCuO_4$ layer and $PbTi_{0.8}Zr_{0.2}O_3$ layer, respectively. Similar results were obtained when $PbTi_{0.8}Zr_{0.2}O_3$ was substituted with $PbTi_{0.5}Zr_{0.5}O_3$ in the above double layer.

Example 6

Figure 13:
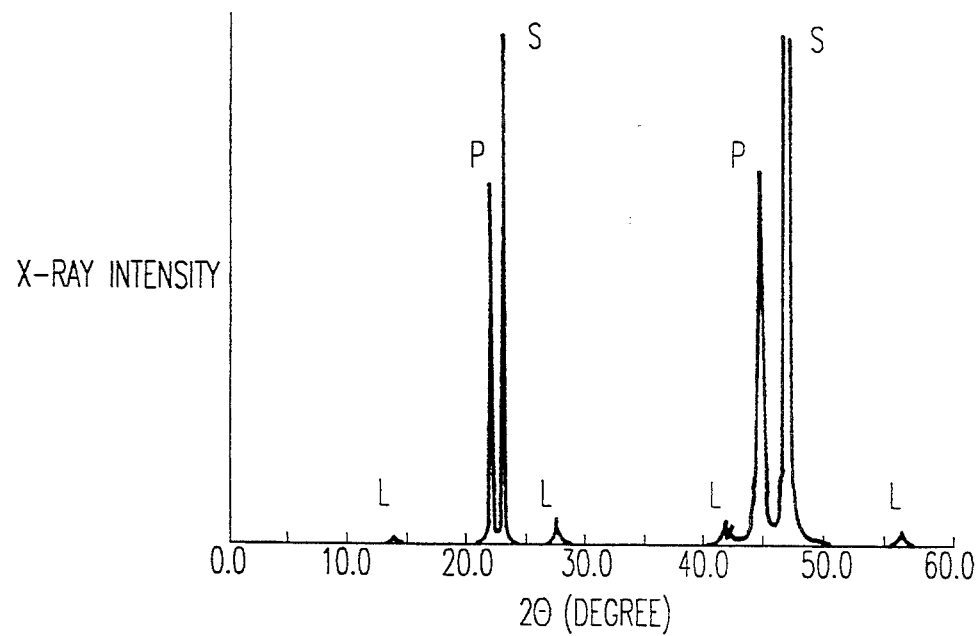
FIG. 13 is an X-ray diffractometry trace of a $PbTi_{0.5}Zr_{0.5}O_3/La_{2-x}Sr_xCuO_4$ multilayer on a $SrTiO_3$ (100) substrate used for the FET in Example 6.

A FET was made with $PbTi_{0.5}Zr_{0.5}O_3/La_{2-x}Sr_xCuO_4$ (x=0.01) in a manner similar to example 3. A double layer was grown epitaxially on a $SrTiO_3$ substrate. The $La_{2-x}Sr_xCuO_4$ layer was c-axis oriented and the $PbTi_{0.5}Zr_{0.5}O_3$ layer was mostly c-axis oriented with a small mixture of a-axis orientation. Channel resistance modulation was also observed as in example 3. FIG. 13 shows X-ray diffraction of the multilayer, which suggested a good interface without reaction of the two layers. S, L and P indicate (001) peaks of the $SrTiO_3$ substrate, $La_{2-x}Sr_xCuO_4$ layer and $PbTi_{0.5}Zr_{0.5}O_3$ layer, respectively.

Figure 14:
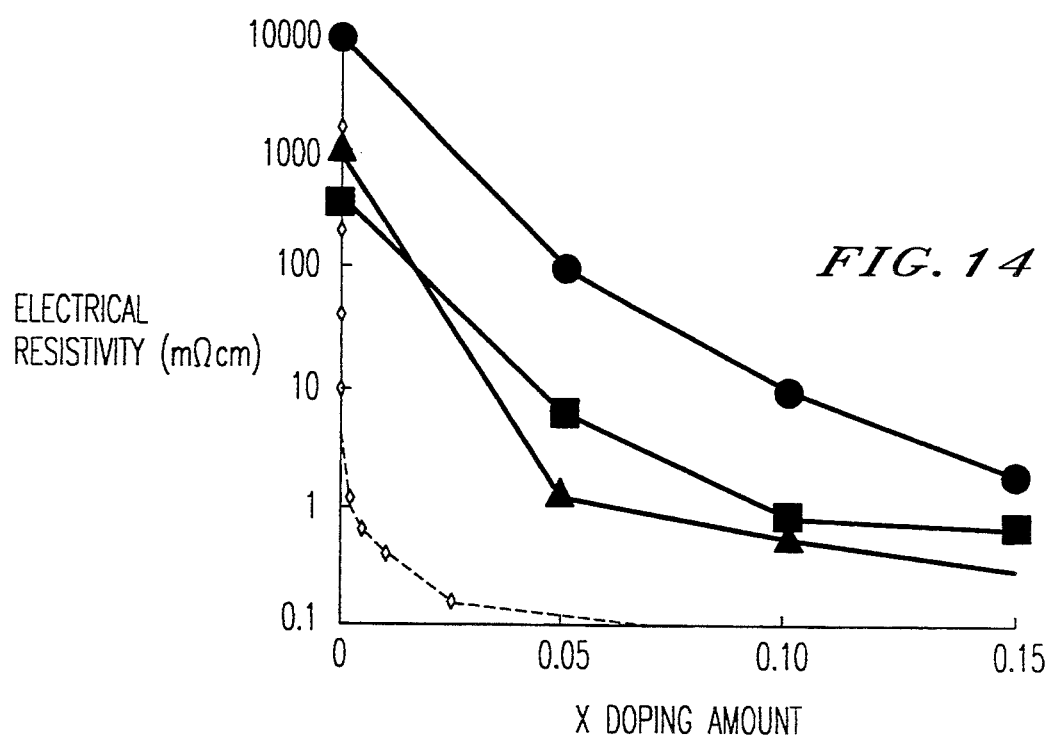
FIG. 14 is a graph showing the doping dependence of the electrical resistivity of the channel layer films examined.

FIG. 14 shows the electrical resistivity as a function of doping dependence for the above mentioned channel layer films and $Pr_{2-x}Ce_xCuO_4$ film 1000 Å thick as compared with p-type Si (documentary values). A black circle represents $Nd_{1-x}Sr_xCoO_3$, a square represents $La_{2-x}Sr_xCuO_4$ and a triangle represents $Pr_{2-x}Ce_xCuO_4$. An open circle represents the p-type Si. Increase and decrease of the carrier greatly affect the electrical resistivities of the present films as compared with the conventional semiconductor material particularly at a high doping levels of x=0.005 to 0.05.

Control 1

The experiment of Example 1 was repeated except that $PrBa_2Cu_3O_{6+d}$ and $SrTiO_3$ substrate were replaced by a Si substrate. X-ray diffraction analysis revealed that an impurity phase was formed and no switching operation was exhibited.

Control 2

The experiment of Example 1 was repeated except that $PrBa_2Cu_3O_{6+d}$ was replaced by a superconductor $YBa_2Cu_3O_{6+d}$ (d~1), the resistivity was less than 1 mΩcm of the same thickness. The dielectric layer was deposited immediately after $YBa_2Cu_3O_{6+d}$ was deposited. On reducing the temperature of the substrate to the room temperature, oxygen was filled in a vacuum chamber to a pressure of not less than 10 torr. The resultant FET was measured at room temperature. Switching due to modulation of the gate electrode was extremely small as the modulation of the voltage Vsd was not larger than 0.01%.

As mentioned above, the oxide semiconductors having the perovskite structure, which are capable of growing on the same substrate as the oxides having the perovskite structure or capable of growing epitaxially with each other, are used to prepare an FET element according to the present invention. This FET is applicable to memories and logic elements where conventional semiconductors cannot be applied. In addition, it is possible to provide a smaller element whose dimensions are smaller than considered to be the limit of conventional Si semiconductor elements.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A field-effect transistor (FET) comprising a source; a drain; a channel formed between the source and the drain; and a gate electrode, wherein the channel is a layer of oxides having the perovskite structure comprised of:
- (1) at least one metal selected from the group consisting of the metal elements selected from the group consisting of Ti, V, Cr, Mn, Fe. Co, Ni, Cu, Zr, Nb, Mo, Tc, Ru, Rh, Pd, Ag, Hf, Ta, W, Re, Os, Ir, Pt, Au, and Bi; and
- (2) at least one metal selected from the group consisting of alkali metals, alkaline earth metals and rare earth metals, said layer having a thickness of not larger than 1000 Å and an electrical resistivity not less than 2 milli-ohm centimeters, said oxide layer channel having provided thereon a metal oxide insulator layer formed thereon, and said gate electrode in electrical contact therewith.

2. The FET of claim 1, wherein the metal oxide insulator layer is a ferroelectric.

3. The FET of claim 2, wherein said metal oxide insulator layer is a ferroelectric and has a perovskite $ABO_3$ structure.

4. The FET of claim 3, wherein said $ABO_3$ ferroelectric has the structure:

$$Pb_{1-y}La_y(Ti_{1-x}Zr_x)_{1-s}O_{3+\delta},$$

where
$x = 0$ to $0.6$;
$y = 0$ to $0.1$;
$\delta = -0.5$ to $0.5$; and
$s = 0$ to $0.1$, where $s = 0$ for $y = 0$.

5. The FET of claim 3, wherein said $ABO_3$ ferroelectric has the formula:

$$(Na_{1-x}K_x)NbO_3,$$

where
$x = 0.01$ to $1$.

6. The FET of claim 2, wherein a dielectric layer is formed between said ferroelectric metal oxide layer and said channel layer having the perovskite structure.

7. The FET of claim 1, wherein said channel is a layer of the oxides having the perovskite structure wherein metal (1) is selected from the group consisting of Ti, V, Cr, Mn, Fe, Co, Ni, Cu, Zr, Nb, Mo, Ta, W and Bi, and metal (2) is selected from the group consisting of Mg, Ca, Sr, Y, Ba, La, Ce, Pr, Nd, Sm, Eu, Gd, Tb, Dy, Ho, Er, Tm and Yb.

8. The FET of claim 7, wherein said channel is a layer of oxide wherein metal (1) is selected from the group consisting of Ti, Cr, Mn, Fe, Co and Cu and metal (2) is selected from the group consisting of Ca, Sr, Ba, La, Ce, Pr, Nd and Sm.

9. The FET of claim 8, wherein said oxide has an $ABO_3$ crystal structure.

10. The FET of claim 6, wherein said oxide having $ABO_3$ crystal structure has the formula:

$$Ln_{1-x}S_xTO_3,$$

where
$x = 0$ to $0.2$;
Ln is La, Ce, Pr or Nd; and
T is Ti, Cr, Mn or Fe.

11. The FET of claim 8, wherein said oxide has an $K_2NiF_4$ crystal structure.

12. The FET of claim 11, wherein said oxide having $K_2NiF_4$ crystal structure has the formula:

$$Ln_{2-x}M_xCuO_{4-d},$$

where
$x = 0$ to $0.05$;
Ln is La, Nd, Pr or Sm;
M is Sr when Ln=La, and M is Ce when Ln is Nd, Pr or Sm; and $0 \leq d \leq 0.2$.

13. The FET of claim 11, wherein said oxide having $K_2NiF_4$ crystal structure has the formula:

$$(La_{1-x}Sr_x)(Nd_{1-y}Ce_y)CuO_4,$$

where
$x = 0$ to $0.05$;
$y = 0$ to $0.05$;
$x + y = 0$ to $0.05$.

14. The FET of claim 7, wherein said channel is a layer of oxide wherein metal (1) is selected from the group consisting of Ti, Cr, Mn, Fe and Cu and metal (2) is selected from the group consisting of Sr, La, Ce, Pr and Nd.

15. The FET of claim 1, wherein the film thickness of said channel layer is not larger than 500 Å and the electrical resistivity thereof ranges from 10 milli-ohm centimeters to 10 mega-ohm centimeters.

16. FET of claim 1, wherein said oxide having perovskite structure is a semiconductive oxide.

17. The FET of claim 1, further comprising another metal oxide insulator layer formed between said oxide layer channel and said metal oxide insulator layer formed thereon.

* * * * *